(12) United States Patent
Choi et al.

(10) Patent No.: US 10,310,341 B2
(45) Date of Patent: Jun. 4, 2019

(54) DISPLAY DEVICE AND METHOD OF MANUFACTURING THE SAME

(71) Applicant: LG DISPLAY CO., LTD., Seoul (KR)

(72) Inventors: WonJun Choi, Paju-si (KR); SungLim Nam, Paju-si (KR); Misun Park, Gwangmyeong-si (KR); Jaewoong Choi, Anyang-si (KR); Younghyun Kong, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 100 days.

(21) Appl. No.: 15/188,503

(22) Filed: Jun. 21, 2016

(65) Prior Publication Data

US 2016/0377905 A1 Dec. 29, 2016

(30) Foreign Application Priority Data

Jun. 29, 2015 (KR) .................. 10-2015-0091910
Apr. 29, 2016 (KR) .................. 10-2016-0053020

(51) Int. Cl.
*G02F 1/1345* (2006.01)
*G02F 1/1368* (2006.01)
(Continued)

(52) U.S. Cl.
CPC ........ *G02F 1/13452* (2013.01); *G02F 1/1339* (2013.01); *G02F 1/1368* (2013.01); *G02F 1/13458* (2013.01); *G02F 1/133345* (2013.01); *G02F 1/133512* (2013.01); *G02F 1/133514* (2013.01); *H01L 24/03* (2013.01); *H01L 24/08* (2013.01); *H01L 24/16* (2013.01); *H01L 24/32* (2013.01); *H01L 24/73* (2013.01); *H01L 27/124* (2013.01); *H01L 27/1218* (2013.01); *H01L 27/1248* (2013.01); *H01L 27/3244* (2013.01); *H01L 27/3276* (2013.01); *H01L 51/56* (2013.01); *G02F 2201/123* (2013.01); *H01L 51/5246* (2013.01); *H01L 2224/03019* (2013.01); *H01L 2224/0384* (2013.01); *H01L 2224/08057* (2013.01); *H01L 2224/16105* (2013.01); *H01L 2224/16155* (2013.01); *H01L 2224/16505* (2013.01);
(Continued)

(58) Field of Classification Search
CPC . G02F 1/13458; G02F 1/1345; G02F 1/13452
See application file for complete search history.

(56) References Cited

U.S. PATENT DOCUMENTS

2013/0271716 A1 10/2013 Ando
2014/0061597 A1 3/2014 Choi et al.
(Continued)

FOREIGN PATENT DOCUMENTS

CN 103376607 A 10/2013
CN 103594485 A 2/2014
(Continued)

*Primary Examiner* — Matthew L Reames
*Assistant Examiner* — John A Bodnar
(74) *Attorney, Agent, or Firm* — Dentons US LLP

(57) ABSTRACT

Disclosed is a display device and a method of manufacturing the same, wherein an end portion of a pad provided on a first substrate is spaced apart and separated from an upper surface of the first substrate, and a connection electrode electrically connected with the pad is in contact with a lateral surface of the pad and a lower surface of the pad.

14 Claims, 14 Drawing Sheets

(51) Int. Cl.
  *G02F 1/1335* (2006.01)
  *G02F 1/1333* (2006.01)
  *G02F 1/1339* (2006.01)
  *H01L 27/12* (2006.01)
  *H01L 23/00* (2006.01)
  *H01L 27/32* (2006.01)
  *H01L 51/56* (2006.01)
  *H01L 51/52* (2006.01)

(52) U.S. Cl.
  CPC ............ *H01L 2224/32105* (2013.01); *H01L 2224/32155* (2013.01); *H01L 2224/73203* (2013.01); *H01L 2924/01047* (2013.01)

(56) References Cited

U.S. PATENT DOCUMENTS

| | | | |
|---|---|---|---|
| 2014/0252944 A1 | 9/2014 | Lee et al. | |
| 2014/0339574 A1* | 11/2014 | Kang | H01L 27/124 257/88 |
| 2016/0079337 A1* | 3/2016 | Mathew | H05B 33/0896 257/40 |

FOREIGN PATENT DOCUMENTS

| | | |
|---|---|---|
| CN | 103681737 A | 3/2014 |
| CN | 104037192 A | 9/2014 |

\* cited by examiner

DISPLAY DEVICE AND METHOD OF MANUFACTURING THE SAME

CROSS REFERENCE TO RELATED APPLICATIONS

This application claims the benefit of Korean Patent Application No. 10-2016-0053020, filed on Apr. 29, 2016, and Korean Patent Application No. 10-2015-0091910, filed on Jun. 29, 2015, all of which are hereby incorporated by reference as if fully set forth herein.

BACKGROUND

Field of the Invention

Embodiments of the present invention relate to a display device and a method of manufacturing the same, and more particularly, to a method of connecting a panel driver with a display panel.

Discussion of the Related Art

Up to now, various display devices have been researched and studied, for example, liquid crystal display devices, plasma display panels, organic light emitting display devices, and etc.

A display device typically includes a display panel for displaying an image, and a panel driver for driving the display panel. Hereinafter, a method of connecting a panel driver with a display panel according to the related art will be described with reference to the accompanying drawings.

FIG. 1A is a plane view illustrating a display device according to the related art, and FIG. 1B is a cross-sectional view along line I-I of FIG. 1A.

As shown in FIGS. 1A and 1B, the display device may include a lower substrate 10, an upper substrate 20, a flexible circuit film 40, and a printed circuit board (PCB) 50. The lower substrate 10 and the upper substrate 20 constitute a display panel, and the flexible circuit film 40 and the printed circuit board 50 constitute a panel driver.

There are various signal lines (not shown) on the lower substrate 10. Also, a signal pad 11 is prepared at an end of the signal line, and the signal pad 11 is connected with the flexible circuit film 40. In more detail, the flexible circuit film 40 is attached to an upper surface of the signal pad 11. For this attachment, the upper surface of the signal pad 11 is exposed. That is, the lower substrate 10 extends out of the upper substrate 20, and the signal pad 11 is provided on the upper surface of the extended lower substrate 10. The flexible circuit film 40 is connected with the printed circuit board 50.

In the related art display device, the flexible circuit film 40 is attached to the exposed upper surface of the signal pad 11, which may increase the bezel area. Also, it may be difficult to provide various types of display devices with aesthetically pleasing appearances due to a height difference in the bezel area.

SUMMARY

Accordingly, the present invention is directed to a display device and a method of manufacturing the same that substantially obviate one or more problems due to limitations and disadvantages of the related art, and a method of manufacturing the same.

An advantage of the present invention is to provide a display device with a reduced bezel area, and a method of manufacturing the same.

To achieve these and other advantages and in accordance with the purpose of embodiments of the invention, as embodied and broadly described herein, a display device may, for example, include first and second substrates confronting each other; a pad on the first substrate; and a connection electrode electrically connected with the pad, wherein an end portion of the pad is spaced apart and separated from an upper surface of the first substrate, and the connection electrode is in contact with a lateral surface of the pad and a lower surface of the pad.

Also, a display device according to one embodiment of the present invention may be manufactured by scribing first and second substrates that are bonded to each other, separating an end portion of a pad on the first substrate from the first substrate, and providing a connection electrode electrically connected with the pad at a lateral surface of each of the first and second substrates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE ILLUSTRATED EMBODIMENTS

Figure 1A:
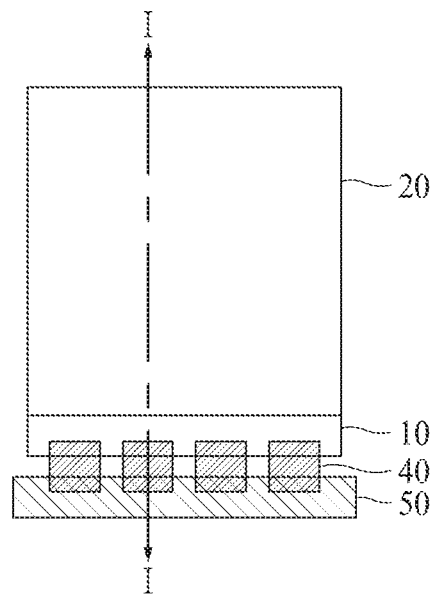
FIG. 1A is a plane view illustrating a related art display device.
Figure 1B:
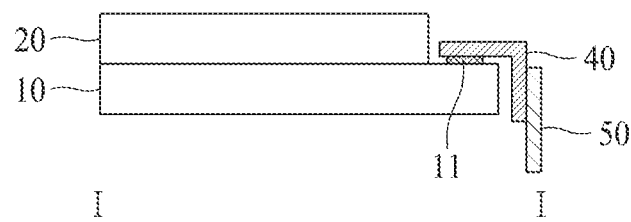
FIG. 1B is a cross-sectional view along line I-I of FIG. 1A.

Reference will now be made in detail to exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In description of embodiments of the present invention, when a structure is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It should be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a display device according to an embodiment of the present invention and a method of manufacturing the same will be described with reference to the accompanying drawings.

Figure 2A:
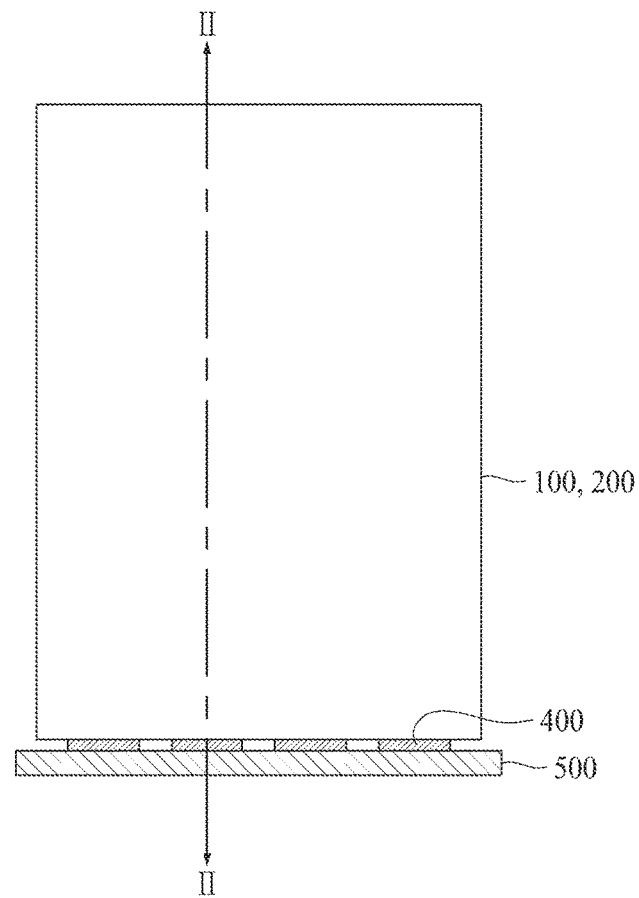
FIG. 2A is a plane view illustrating a display device according to one embodiment of the present invention.
Figure 2B:
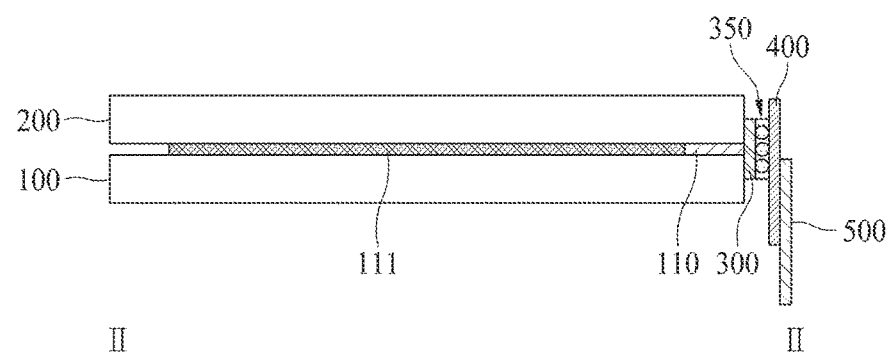
FIG. 2B is a cross-sectional view along line I-I of FIG. 2A.

FIG. 2A is a plane view illustrating a display device according to one embodiment of the present invention, and FIG. 2B is a cross-sectional view along line I-I of FIG. 2A.

Referring to FIG. 2A, the display device according to one embodiment of the present invention may include a first substrate 100, a second substrate 200, a flexible circuit film 400, and a printed circuit board (PCB) 500.

The first substrate 100 and the second substrate 200 are bonded to each other, to thereby form a display panel. The flexible circuit film 400 and the printed circuit board 500 constitute a panel driver. The flexible circuit film 400 is attached to the display panel, and the printed circuit board 500 is connected with the flexible circuit film 400.

The first substrate 100 and the second substrate 200 have substantially the same shape. For example, the first substrate 100 and the second substrate 200 may have a rectangular structure with the same shape. That is, as compared with the display device according to the related art, a predetermined area of the first substrate 100 is not extended out of the second substrate 200 for an attachment of the flexible circuit film 400. In other words, one side of the first substrate 100, to which the flexible circuit film 400 is to be attached, corresponds exactly or substantially to one side of the second substrate 200. Thus, the flexible circuit film 400 is not attached to an upper surface of the first substrate 100, but attached to a lateral side of the display panel.

In FIG. 2A, the flexible circuit film 400 and the printed circuit board (PCB) 500 are connected with each other at a lower portion of the display panel. Alternatively, at another side of the display panel, for example, a left portion of the display panel, the flexible circuit film 400 and the printed circuit board (PCB) 500 can be connected with each other.

Referring to FIG. 2B, the first substrate 100 and the second substrate 200 confront each other, and a length of the first substrate 100 is the same as a length of the second substrate 200. Also, one end of the first substrate 100 corresponds to one end of the second substrate 200, and the other end of the first substrate 100 corresponds to the other end of the second substrate 200. A detailed structure of each of the first substrate 100 and the second substrate 200 may vary depending on a type of display devices.

For example, if the display device is applied to a liquid crystal display (LCD) device, a thin film transistor and a pixel electrode may be provided on the first substrate 100, a black matrix and a color filter may be provided on the second substrate 200, and a liquid crystal layer may be interposed between the first substrate 100 and the second substrate 200, but the embodiment of the present invention is not limited to this structure, and various structures generally known to those skilled in the art can be used. Also, various modes of LCD devices generally known to those skilled in the art, for example, Twisted Nematic (TN) mode, In-Plane Switching (IPS) mode, Vertical Alignment (VA) mode, or Fringe Field Switching (FFS) mode can be used. Based on the selected mode of the display device, a structure of each of the first substrate 100 and the second substrate 200 may change.

Also, if the display device is applied to an organic light emitting display (OLED) device, a thin film transistor and an organic light emitting device including an anode, an emission layer, and a cathode may be provided on the first substrate 100, and the second substrate 200 may be formed of an encapsulation substrate, but the embodiment of the present invention is not limited to this structure, and various structures generally known to those skilled in the art can be used.

A line 111 is provided on the first substrate 100, and a pad 110 is connected with an end of the line 111. The line 111 may be a signal line, for example, a gate line, a data line, or a common voltage line, or may be a non-signal line such as an antistatic line. In FIG. 2B, the pad 110 is provided at the same layer as that of the line 111, and is formed as one body with the line 111, but the embodiment is not limited to this structure. For example, the line 111 may be a data line provided on a gate insulating film, and the pad 110 may be a data pad provided under the gate insulating film. In this case, the data pad and the data line are connected with each other via a contact hole provided in the gate insulating film.

In an area provided with the pad 110, one end of the first substrate 100 corresponds to one end of the second substrate 200. Thus, the flexible circuit film 400 may not be connected with an upper surface of the pad 110, but connected with a side of the pad 110. Herein, the side of the pad 110, to which the flexible circuit film 400 is connected, has a small contact area so that it may cause a bad connection state between the pad 110 and the flexible circuit film 400. In order to realize a good connection state between the pad 110 and the flexible circuit film 400, a connection electrode 300 may be provided at the side of the pad 110.

The connection electrode 300 is in contact with each side of the first substrate 100 and the second substrate 200 provided with the pad 110, whereby the connection electrode 300 is directly connected with the side of the pad 110.

In order to attach the flexible circuit film 400 to the connection electrode 300, a conductive adhesive layer 350 may be provided between the connection electrode 300 and the flexible circuit film 400. For example, a conductive ball may be provided inside the conductive adhesive layer 350, whereby the connection electrode 300 and the flexible circuit film 400 can be electrically connected with each other through the conductive ball.

The flexible circuit film 400 may not be provided on the upper surface of the first substrate 100, and the flexible circuit film 400 is disposed in a vertical direction at each side of the first substrate 100 and the second substrate 200. Also, the printed circuit board 500 is connected with the flexible circuit film 400.

Although not shown, a driving chip such as a driving integrated circuit may be provided on the flexible circuit film 400 so as to form a chip on film (COF) structure, but the embodiment of the present invention is not limited to this structure. Also, a lead line is provided on the flexible circuit film 400, and the lead line is connected with the connection electrode 300 through the conductive ball of the conductive adhesive layer 350.

The printed circuit board 500 provides various signals to the display panel through the flexible circuit film 400. Although not shown, a timing controller, various power circuits, or a memory device may be provided on the printed circuit board 500.

According to one embodiment of the present invention, the connection electrode 300 is connected with the pad 110 at a lateral side of each of the first and second substrates 100 and 200, whereby the flexible circuit film 400 is attached to each lateral side of the first substrate 100 and the second substrate 200. Thus, there is no need to extend the first substrate 100 out of the second substrate 200 so as to expose the upper surface of the pad 110 to the external. Accordingly, a bezel area of the display device according to an embodiment of the present invention can be decreased in comparison to that of the display device according to the related art. Also, one end of the first substrate 100 may correspond to one end of the second substrate 200, and the other end of the first substrate 100 may correspond to the other end of the second substrate 200 so that it is possible to reduce or prevent a height difference in the bezel area.

Also, according to one embodiment of the present invention, the connection electrode 300, which contacts a lateral side of the pad 110, is provided between the flexible circuit film 400 and the pad 100 for an electrical connection. To further improve the connection property between the connection electrode 300 and the pad 110, various structures according to embodiments of the present invention will now be described in detail.

Figure 3:
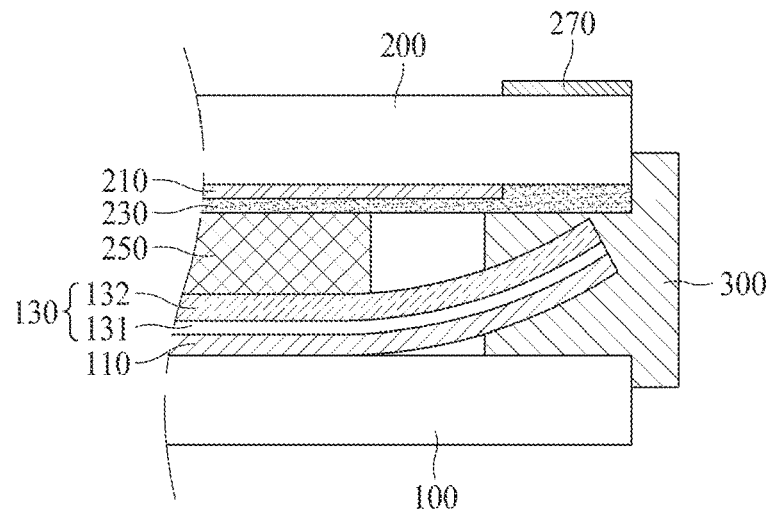
FIG. 3 is a cross-sectional view illustrating a display device according to an embodiment of the present invention.

FIG. 3 is a cross-sectional view illustrating a display device according to another embodiment of the present invention, which shows an end area of each of first and second substrates 100 and 200 to which a flexible circuit film is attached. For convenience of explanation, a printed circuit board and a flexible circuit film connected with a connection electrode will not be shown in FIG. 3. Also, a detailed description of the same parts as those of the previous embodiment described with reference to FIGS. 2A and 2B will be omitted.

Referring to FIG. 3, first and second substrates 100 and 200 confront each other, wherein one end of the first substrate 100 corresponds exactly or substantially to one end of the second substrate 200.

A pad 110 is provided on the first substrate 100, and an insulating layer 130 is provided on the pad 110.

A predetermined portion of the pad 110 is in contact with an upper surface of the first substrate 100, and the remaining portion of the pad 110 is not in contact with the upper surface of the first substrate 100. In more detail, an end portion of the pad 110 is peeled-off from the upper surface of the first substrate 100, that is, the end portion of the pad 110 is separated from the upper surface of the first substrate 100. As illustrated in FIG. 3, a separation distance between the upper surface of the first substrate 100 and the pad 110 is gradually increased from its separation starting point toward the end portion of the pad 110.

The insulating layer 130 may include a first insulating layer 131 provided on the pad 110, and a second insulating layer 132 provided on the first insulating layer 131. The first insulating layer 131 may be a gate insulating film, and the second insulating layer 132 may be a planarization film. The gate insulating film may be formed of an inorganic insulating material such as silicon oxide or silicon nitride, and the planarization film may be formed of an organic insulating material such as photoacryl, but the embodiment of the present invention is not limited to these materials.

A sealant 250 is provided between the first substrate 100 and the second substrate 200 to bond the first and second substrates 100 and 200. The sealant 250 is not extended to the end portion of the first substrate 100 or second substrate 200. That is, an end portion of the sealant does not correspond to the end portion of each of the first and second substrates 100 and 200. Accordingly, in comparison to the end portion of the pad 110 or insulating layer 130, the end portion of the sealant 250 is relatively distanced from the end portion of the first substrate 100 or second substrate 200. In other words, a distance between the end portion of the sealant 250 and the end portion of the first substrate 100 or second substrate 200 is larger than a distance between the end portion of the pad 110 or insulating layer 130 and the end portion of the first substrate 100 or second substrate 200. In this case, an area without the sealant 250 is provided between the first substrate 100 and the second substrate 200, in which the pad 110 is capable of being separated from and upwardly bent on the upper surface of the first substrate 100.

As the end portion of the pad 110 is separated from and upwardly bent on the upper surface of the first substrate 100, an empty space is provided between a lower surface of the pad 110 and the upper surface of the first substrate 100, whereby a connection electrode 300 may be partially provided in the empty space. Accordingly, the connection electrode 300 is in contact with a lateral surface of the pad 110 as well as a lower surface of the pad 110, to thereby improve the connection property between the connection pad 300 and the pad 110. In this embodiment, the lower surface of the pad 110 means the surface confronting the first substrate 100, and the lower surface of the pad 110 being in contact with the connection electrode 300 means the surface being peeled-off and separated from the upper surface of the first substrate 100, as illustrated in FIG. 3.

The connection electrode 300 is in contact with a lateral surface of the first substrate 100, and a lateral surface of the second substrate 200. As illustrated in FIG. 3, the connection electrode 300 may protrude from the lateral surfaces of the first substrate 100, and the second substrate 200. The connection electrode 300 may be formed of a material with good conductivity, for example, argentums (Ag), but the embodiment of the present invention is not limited to this material.

A light-shielding layer 210, an overcoat layer 230, and a light-leakage prevention pattern 270 may be provided on the second substrate 200.

The light-shielding layer 210 and the overcoat layer 230 are provided on one surface of the second substrate 200, and more particularly, a lower surface of the second substrate 200 confronting the first substrate 100.

The light-shielding layer 210 serves to reduce or prevent light from leaking in other regions except a pixel region, and the light-shielding layer 210 may be formed in a matrix configuration. If the light-shielding layer 210 extends to the end portion of the second substrate 200, the light-shielding layer 210 may be connected with the connection electrode 300. In this case, electric charges may flow into the light-shielding layer 210, whereby it may have an adverse influence on an image displayed in the pixel region. Accordingly, as illustrated in FIG. 3, the light-shielding layer 210 may not be extended to the end portion of the second substrate 200. That is, the end portion of the light-shielding layer 210 does not correspond to the end portion of the second substrate 200, preferably.

The overcoat layer 230 is provided on a lower surface of the light-shielding layer 210, to thereby reduce or prevent the light-shielding layer 210 from being exposed to the external. In more detail, the overcoat layer 230 covers lower and lateral surfaces of the light-shielding layer 210, to thereby insulate the light-shielding layer 210 from the connection electrode 300. Accordingly, the connection electrode 300 is in contact with the overcoat layer 230, but may not be in contact with the light-shielding layer 210.

If the light-shielding layer 210 is not extended to the end portion of the second substrate 200, a light leakage may occur in the end portion of the second substrate 200 which is not covered by the light-shielding layer 210. In order to reduce or prevent such a light leakage, the connection electrode 300 may be overlapped with the light-shielding layer 210, preferably. Also, a light-leakage prevention pattern 270 may be additionally provided on the other surface of the second substrate 200, and more particularly, an upper surface of the second substrate 200 which does not confront the first substrate 100. The light-leakage prevention pattern 270 is provided above the end portion of the second substrate 200 which is not covered by the light-shielding layer 210. Especially, the light-leakage prevention pattern 270 is overlapped with the light-shielding layer 210, to thereby reduce or prevent light leakage in the end portion of the second substrate 200 which is not covered by the light-shielding layer 210.

Figure 4:
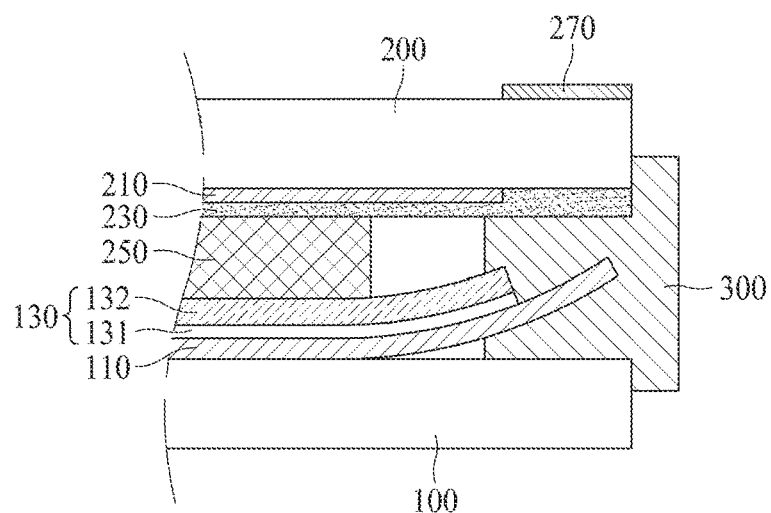
FIG. 4 is a cross-sectional view illustrating a display device according to an embodiment of the present invention.

FIG. 4 is a cross-sectional view illustrating a display device according to another embodiment of the present invention. Except for a structure of an insulating layer, the display device illustrated in FIG. 4 is the same as the display device illustrated in FIG. 3. Thus, only different parts will be described in detail.

Referring to FIG. 4, a pad 110 is provided on a first substrate 100, and an insulating layer 130 is provided on the pad 110.

As described above with reference to FIG. 3, the end portion of the pad 110 corresponds to the end portion of the insulating layer 130. Meanwhile, the end portion of the pad 110 in FIG. 4 does not correspond to the end portion of the insulating layer 130. That is, in comparison to the end portion of the pad 110, the end portion of the insulating layer 130 in FIG. 4 is relatively distanced from the end portion of the first substrate 100 or second substrate 200. In other words, a distance between the end portion of the insulating layer 130 and the end portion of the first substrate 100 or second substrate 200 is larger than a distance between the end portion of the pad 110 and the end portion of the first substrate 100 or second substrate 200. In this structure, an upper surface of the pad 110 is exposed, and a connection electrode 300 is in contact with the upper surface of the pad 110. In this embodiment, the upper surface of the pad 110 means a surface which does not confront the first substrate 100, that is, a surface which is opposite to a lower surface of the aforementioned pad 110.

The connection electrode 300 is in contact with a lateral surface of the pad 110, the lower surface of the pad 110, and the upper surface of the pad 110, to thereby improve the connection property between the connection electrode 300 and the pad 110.

Figure 5:
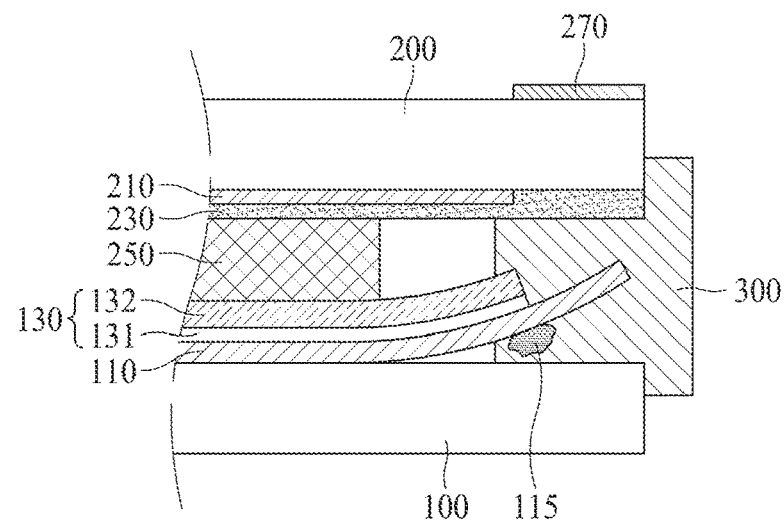
FIG. 5 is a cross-sectional view illustrating a display device according to an embodiment of the present invention.

FIG. 5 is a cross-sectional view illustrating a display device according to another embodiment of the present invention. Except for an additionally-provided conductive residue 115, the display device of FIG. 5 is the same as the display device of FIG. 4. Thus, only different parts will be described in detail.

Referring to FIG. 5, a conductive residue 115 is additionally provided between a pad 110 and a first substrate 100. The conductive residue 115 may be formed of a residue of the pad 110, which is generated during a process of separating an end portion of the pad 110 from the first substrate 100. For example, a grinding process for separating the end portion of the pad 110 from the first substrate 100 is carried out in the end portion of the pad 110. At this time, a residue removed from the end portion of the pad 110 comes into an area between the first substrate 100 and the pad 110, to thereby form the conductive residue 115. Accordingly, the conductive residue 115 and the pad 110 are formed of the same material.

If the conductive residue 115 is formed by controlling the grinding process for the end portion of the pad 110, the conductive residue 115 is in contact with a lower surface of the pad 110. Accordingly, a connection electrode 300 is in contact with a lateral surface, the lower surface of the pad 110, an upper surface of the pad 110, and the conductive residue 115, to thereby improve the connection property between the connection electrode 300 and the pad 110.

Figure 6:
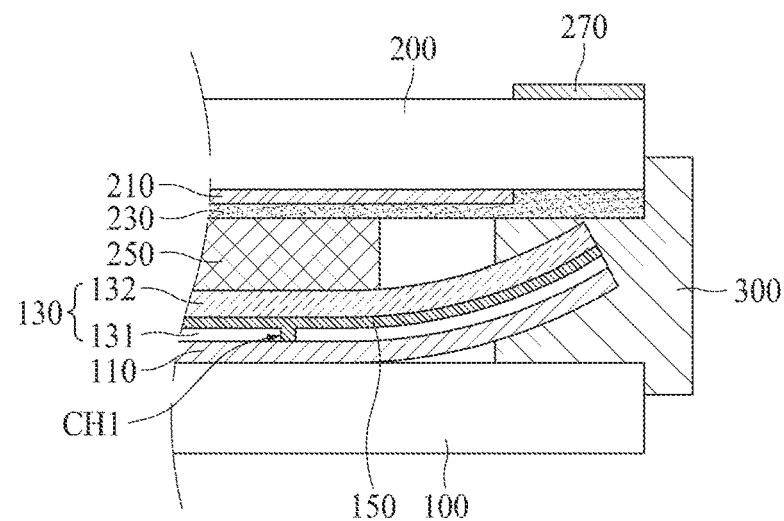
FIG. 6 is a cross-sectional view illustrating a display device according to an embodiment of the present invention.

FIG. 6 is a cross-sectional view illustrating a display device according to another embodiment of the present invention. Except for an additionally-provided auxiliary electrode 150, the display device of FIG. 6 is the same as the display device of FIG. 3. Thus, only different parts will be described in detail.

Referring to FIG. 6, an auxiliary electrode 150 is provided between a first insulating layer 131 and a second insulating layer 132. The auxiliary electrode 150 is connected with a pad 110 via a first contact hole (CH1) provided in the first insulating layer 131. Also, a lateral surface of the auxiliary electrode 150 is connected with a connection electrode 300. The auxiliary electrode 150 may be formed of the same material as that of source/drain electrode of a thin film transistor provided in an active area of a display panel, and the auxiliary electrode 150 and the source/drain electrode may be manufactured by the same process. Accordingly, there may be no need for an additional process of forming the auxiliary electrode 150.

In FIG. 6, the connection electrode 300 is in contact with a lateral surface of the pad 110, the lower surface of the pad 110, and a lateral surface of the auxiliary electrode 150, to thereby improve the connection property between the connection electrode 300 and the pad 110.

Figure 7:
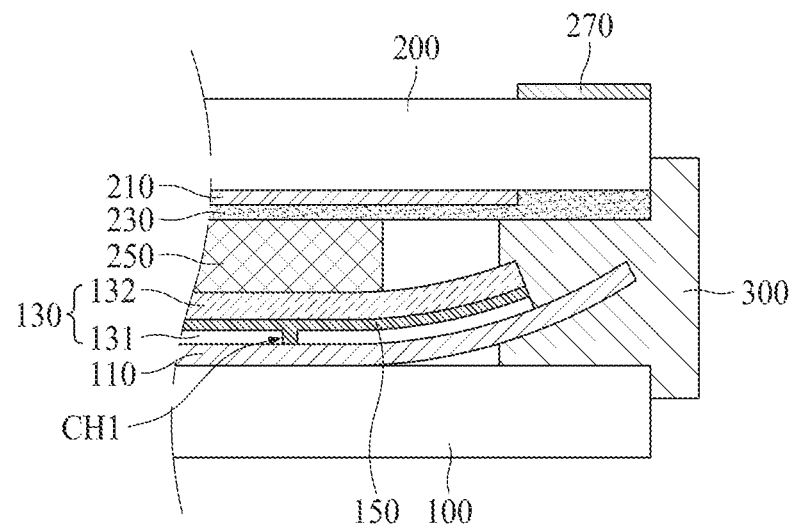
FIG. 7 is a cross-sectional view illustrating a display device according to an embodiment of the present invention.

FIG. 7 is a cross-sectional view illustrating a display device according to another embodiment of the present invention. Except for an additionally-provided auxiliary electrode 150, the display device of FIG. 7 is the same as the display device of FIG. 4. Thus, only different parts will be described in detail.

Referring to FIG. 7, an auxiliary electrode 150 is provided between a first insulating layer 131 and a second insulating layer 132. The auxiliary electrode 150 is connected with a pad 110 via a first contact hole (CH1) provided in the first insulating layer 131. Also, a lateral surface of the auxiliary electrode 150 is connected with a connection electrode 300. The auxiliary electrode 150 may be formed of the same material as that of source/drain electrode of a thin film transistor provided in an active area of a display panel, and the auxiliary electrode 150 and the source/drain electrode may be manufactured by the same process. Accordingly, there may be no need for an additional process of forming the auxiliary electrode 150.

In FIG. 7, the connection electrode 300 is in contact with a lateral surface of the pad 110, the lower surface of the pad 110, the upper surface of the pad 110, and a lateral surface of the auxiliary electrode 150, to thereby improve the connection property between the connection electrode 300 and the pad 110.

Figure 8:
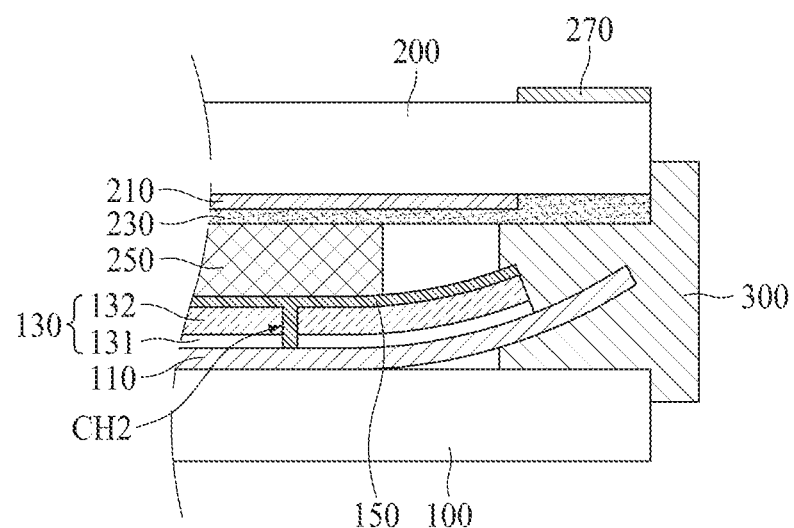
FIG. 8 is a cross-sectional view illustrating a display device according to an embodiment of the present invention.

FIG. 8 is a cross-sectional view illustrating a display device according to another embodiment of the present invention. Except for an additionally-provided auxiliary electrode 150, the display device of FIG. 8 is the same as the display device of FIG. 4. Thus, only different parts will be described in detail.

Referring to FIG. 8, an auxiliary electrode 150 is provided on a second insulating layer 132. The auxiliary electrode 150 is connected with a pad 110 via a second contact hole (CH2) provided in a first insulating layer 131 and the second insulating layer 132. As the auxiliary electrode 150 is positioned on the second insulating layer 132, an upper surface of the auxiliary electrode 150 is connected with a connection electrode 300. Also, a lateral surface of the auxiliary electrode 150 is connected with the connection electrode 300. The auxiliary electrode 150 may be formed of the same material as that of a pixel electrode provided in an active area of a display panel, and the auxiliary electrode 150 and the pixel electrode may be disposed in the same layer and manufactured by the same process. Accordingly, there may be no need for an additional process of forming the auxiliary electrode 150.

In FIG. 8, the connection electrode 300 is in contact with a lateral surface of the pad 110, the lower surface of the pad 110, the upper surface of the pad 110, the upper surface of the auxiliary electrode 150, and a lateral surface of the auxiliary electrode 150, to thereby improve the connection property between the connection electrode 300 and the pad 110.

Meanwhile, although not shown, it is possible to additionally provide the auxiliary electrode 150 on the second insulating layer 132 in the aforementioned structure of FIG. 3. In this case, the connection electrode 300 is in contact with a lateral surface of the pad 110, the lower surface of the pad 110, the upper surface of the auxiliary electrode 150, and a lateral surface of the auxiliary electrode 150.

Figure 9:
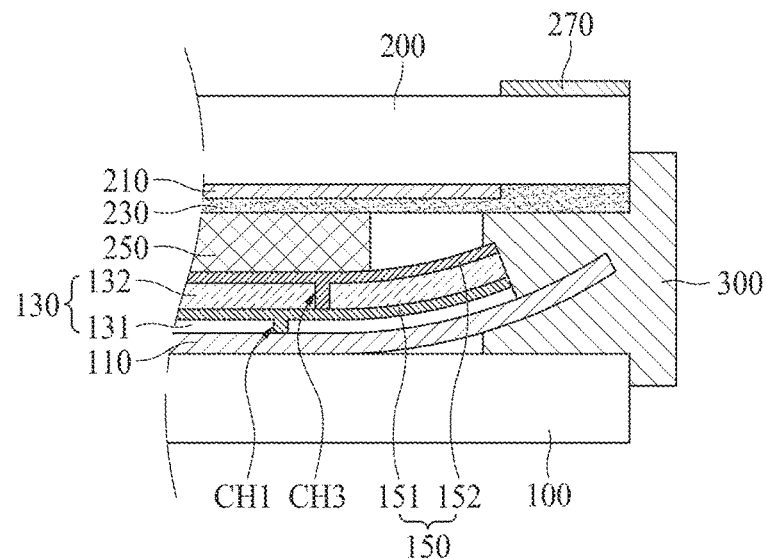
FIG. 9 is a cross-sectional view illustrating a display device according to an embodiment of the present invention.

FIG. 9 is a cross-sectional view illustrating a display device according to another embodiment of the present invention. Except for an additionally-provided auxiliary electrode 150, the display device of FIG. 9 is the same as the display device of FIG. 4. Thus, only different parts will be described in detail.

Referring to FIG. 9, a first auxiliary electrode 151 is provided between a first insulating layer 131 and a second insulating layer 132, and a second auxiliary electrode 152 is provided on the second insulating layer 132.

The first auxiliary electrode 151 is connected with a pad 110 via a first contact hole (CH1) provided in the first insulating layer 131. The second auxiliary electrode 152 is connected with the first auxiliary electrode 151 via a third contact hole (CH3) provided in the second insulating layer 132. The first auxiliary electrode 151, the second auxiliary electrode 152, and the pad 110 are electrically connected with one another.

The first auxiliary electrode 151 may be formed of the same material as that of source/drain electrode of a thin film transistor provided in an active area of a display panel, and the first auxiliary electrode 151 and the source/drain electrode may be disposed in the same layer and manufactured by the same process. Accordingly, there may no need for an additional process of forming the first auxiliary electrode 151. The second auxiliary electrode 152 may be formed of the same material as that of a pixel electrode provided in the active area of the display panel, and the second auxiliary electrode 152 and the pixel electrode may be disposed in the same layer and manufactured by the same process. Accordingly, there may be no need for an additional process of forming the second auxiliary electrode 152.

In this case, a lateral surface of the first auxiliary electrode 151 is connected with a connection electrode 300. Also, an upper surface of the second auxiliary electrode 152, and a lateral surface of the second auxiliary electrode 152 are connected with the connection electrode 300.

In FIG. 9, the connection electrode 300 is in contact with a lateral surface of the pad 110, the lower surface of the pad 110, the upper surface of the pad 110, a lateral surface of the first auxiliary electrode 151, the upper surface of the second auxiliary electrode 152, and a lateral surface of the second auxiliary electrode 152, to thereby improve the connection property between the connection electrode 300 and the pad 110.

Meanwhile, although not shown, it is possible to additionally provide the first auxiliary electrode 151 between the first insulating layer 131 and the second insulating layer 132, and to additionally provide the second auxiliary electrode 152 on the second insulating layer 132 in the above structure of FIG. 3. In this case, the connection electrode 300 is in contact with a lateral surface of the pad 110, the lower surface of the pad 110, a lateral surface of the first auxiliary electrode 151, the upper surface of the second auxiliary electrode 152, and a lateral surface of the second auxiliary electrode 152.

Figure 10:
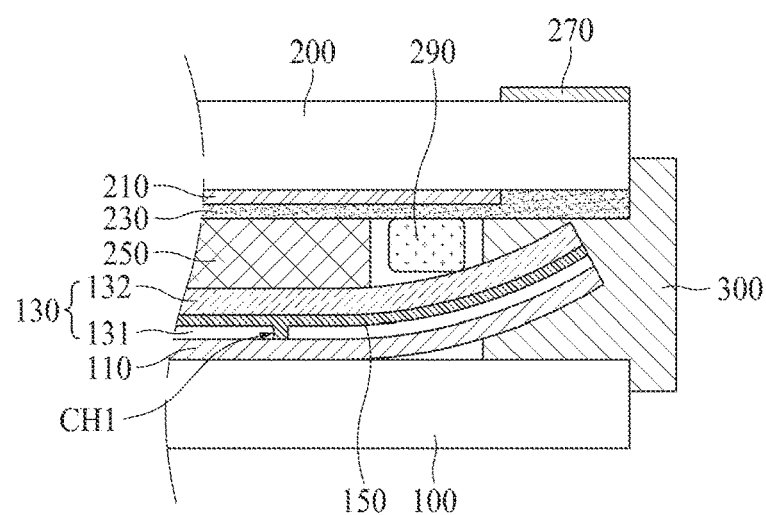
FIG. 10 is a cross-sectional view illustrating a display device according to another embodiment of the present invention.

FIG. 10 is a cross-sectional view illustrating a display device according to another embodiment of the present invention. Except for an additionally-provided stopper 290, the display device of FIG. 10 is the same as the display device of FIG. 6. Thus, only different parts will be described in detail.

In the embodiments described above, the end portion of the pad 110 is peeled-off and separated from the upper surface of the first substrate 100, and the separated end portion of the pad 110 is bent, so that the insulating layer 130 provided on the end portion of the pad 110 is also bent. The pad 110 may be formed of a flexible metal material. Thus, when the pad 110 is separated from and bent on the upper surface of the first substrate 100, cracks may not occur. On the other hand, the insulating layer 130 may be formed of a material having a relatively-small flexibility. Thus, if the insulating layer 130 is bent, cracks may occur in the insulating layer 130 or internal parts of the insulating layer 130 are apt to be broken. Especially, if the insulating layer 130 is formed of an inorganic insulating material such as silicon nitride SiNx, problems relating to cracks or broken parts in the insulating layer 130 may become serious due to crystalline properties of the inorganic insulating material. Cracks or broken parts in the insulating layer 130 may also adversely affect the signal transmission of the pad 110.

Referring to FIG. 10, a stopper 290 is provided on one surface of a second substrate 200, and more particularly, a lower surface of the second substrate 200 confronting the first substrate 100. Thus, it is possible to adjust a bending degree in the pad 110 and the insulating layer 130 by the use of stopper 290. That is, when the pad 110 and the insulating layer 130 are bent, the stopper 290 can reduce or prevent the pad 110 and the insulating layer 130 from being bent more than a predetermined degree. Accordingly, the bending degree of the insulating layer 130 can be controlled by appropriately adjusting a thickness of the stopper 290 so that it is possible to reduce or prevent cracks or broken parts inside the insulating layer 130 as well as cracks in the pad 110. In other words, it is possible to reduce or prevent cracks in the pad 110 and the insulating layer 130 by adjusting the bending degree of the pad 110 and the insulating layer 130 through the use of stopper 290.

The stopper 290 is provided between the pad 110 and the second substrate 200, and more particularly, between the insulating layer 130 and an overcoat layer 230. In more detail, the stopper 290 may be fixedly provided on a lower surface of the overcoat layer 230. Also, the stopper 290 may be in contact with the insulating layer 130. However, if the bending degree of the insulating layer 130 is not so large, the stopper 290 may be not in contact with the insulating layer 130.

The stopper 290 is provided in an area overlapped with a bent portion of the pad 110 and the insulating layer 130. That is, the stopper 290 is provided in the end portion of the pad 110 separated from the upper surface of the first substrate 100, that is, an area overlapped with the end portion of the pad 110 being not in contact with the upper surface of the first substrate 110.

In FIG. 10, the stopper 290 is applied to the structure illustrated in FIG. 6, but the embodiment of the present invention is not limited thereto. The stopper 290 may be applied to any one of the structures illustrated in FIGS. 3 to 5 and FIGS. 7 to 9.

Figure 11:
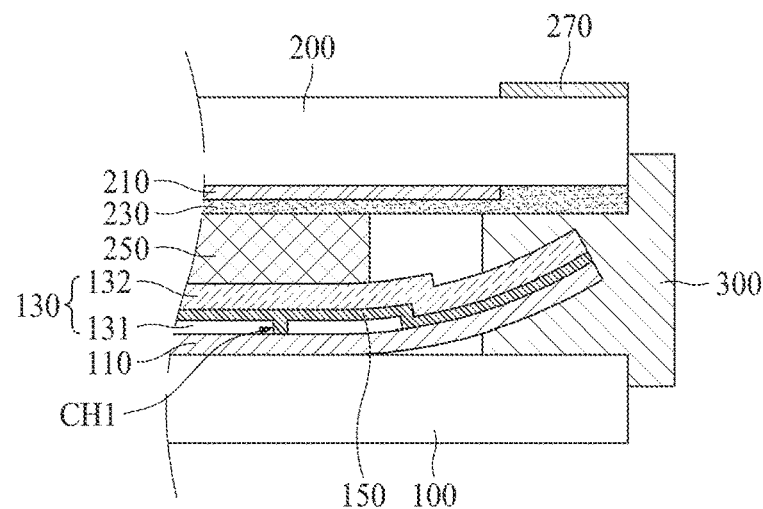
FIG. 11 is a cross-sectional view illustrating a display device according to an embodiment of the present invention.

FIG. 11 is a cross-sectional view illustrating a display device according to another embodiment of the present invention. Except for a structure of each of an insulating layer 130 and an auxiliary electrode 150, the display device of FIG. 11 is the same as the display device of FIG. 6. Thus, only different parts will be described in detail.

Similar to the structure illustrated in FIG. 10, the structure of FIG. 11 is provided to reduce or prevent cracks in a pad 110. As described above, cracks in the pad 110 may be caused by cracks or broken parts inside an insulating layer 130. Thus, it is possible to reduce or prevent cracks in the pad 110 by reducing or preventing cracks or broken parts inside the insulating layer 130.

Referring to FIG. 11, a first insulating layer 131 is provided on the pad 110, an auxiliary electrode 150 is connected with the pad 110 via a first contact hole (CH1) on the first insulating layer 131, and a second insulating layer 132 is provided on the auxiliary electrode 150. In this case, an end portion of the first insulating layer 131 is not extended to an end portion of the pad 110. That is, in comparison to the end portion of the pad 110, the end portion of the first insulating layer 131 is relatively distanced from an end portion of a first substrate 100. As the end portion of the first insulating layer 131 is not extended to the end portion of the pad 110, a lower surface of the auxiliary electrode 150 is in direct contact with an upper surface of the end portion of the pad 110. That is, in comparison to the end portion of each of the pad 110, auxiliary electrode 150 and second insulating layer 132, the end portion of the first insulating layer 131 is relatively distanced from the end portion of the first substrate 100 or second substrate 200. In other words, a distance between the end portion of the first insulating layer 131 to the end portion of the first substrate 100 or second substrate 200 is larger than a distance between the end portion of the first substrate 100 or second substrate 200 and the end portion of the pad 110, auxiliary electrode 150 or second insulating layer 132.

In this embodiment, the first insulating layer 131 is not bent or bent slightly so that it is possible to reduce or prevent cracks or broken parts inside the first insulating layer 131, to thereby reduce or prevent cracks or broken parts in the pad 110 and the auxiliary electrode 150.

In FIG. 11, the end portion of the second insulating layer 132 is extended to the end portion of the pad 110, but the embodiment of the present invention is not limited to this structure. For example, the end portion of the second insulating layer 132 may be not extended to the end portion of the pad 110.

Figure 12:
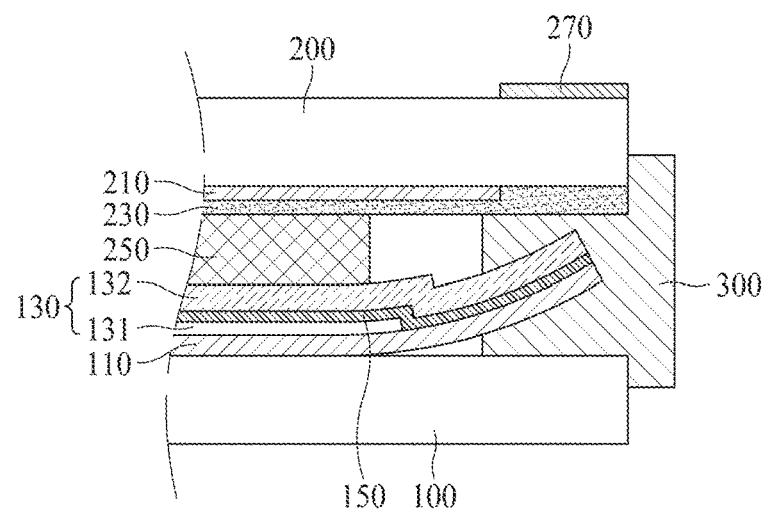
FIG. 12 is a cross-sectional view illustrating a display device according to an embodiment of the present invention.

FIG. 12 is a cross-sectional view illustrating a display device according to another embodiment of the present invention. Except that a first contact hole (CH1) is not provided, the display device of FIG. 12 is the same as the display device of FIG. 11. Thus, only different parts will be described in detail.

Referring to FIG. 12, an end portion of a first insulating layer 131 is not extended to an end portion of a pad 110, whereby a lower surface of an auxiliary electrode 150 is in direct contact with an upper surface of the end portion of the pad 110. Accordingly, the pad 110 and the auxiliary electrode 150 are connected with each other, whereby it is unnecessary to provide a first contact hole (CH1) for an electrical connection between the pad 110 and the auxiliary electrode 150.

Figure 13:
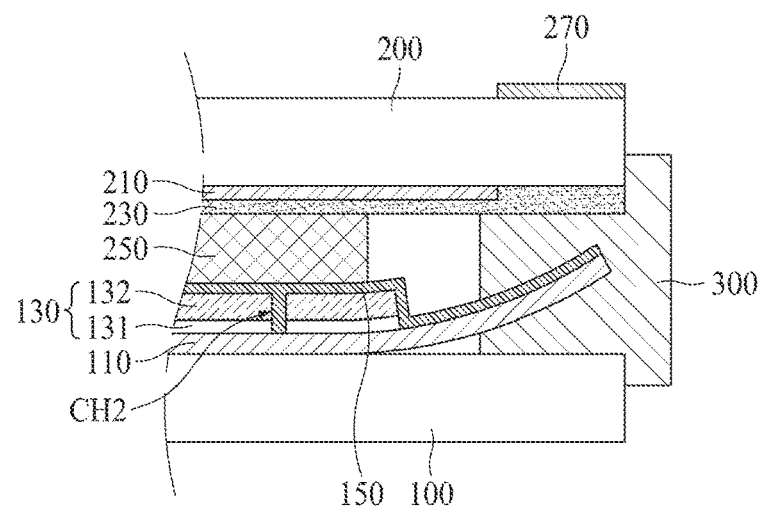
FIG. 13 is a cross-sectional view illustrating a display device according to an embodiment of the present invention.

FIG. 13 is a cross-sectional view illustrating a display device according to another embodiment of the present invention. Except for a structure of each of an insulating layer 130 and an auxiliary electrode 150, the display device of FIG. 13 is the same as the display device of FIG. 8. Thus, only different parts will be described in detail.

Referring to FIG. 13, an end portion of a first insulating layer 131 and an end portion of a second insulating layer 132 are not extended to an end portion of a pad 110, and an end portion of an auxiliary electrode 150 is extended to the end portion of the pad 110. Accordingly, a lower surface of the auxiliary electrode 150 is in direct contact with an upper surface of the end portion of the pad 110.

In this embodiment, the first insulating layer 131 and the second insulating layer 132 are not bent or bent slightly so that it is possible to reduce or prevent cracks or broken parts inside the first insulating layer 131 and the second insulating layer 132, to thereby reduce or prevent cracks or broken parts in the pad 110 and the auxiliary electrode 150.

In FIG. 13, there is a second contact hole (CH2) for a connection between the pad 110 and the auxiliary electrode 150. However, the end portion of the pad 110 is connected with the end portion of the auxiliary electrode 150, whereby it is possible to omit the second contact hole (CH2).

Figure 14:
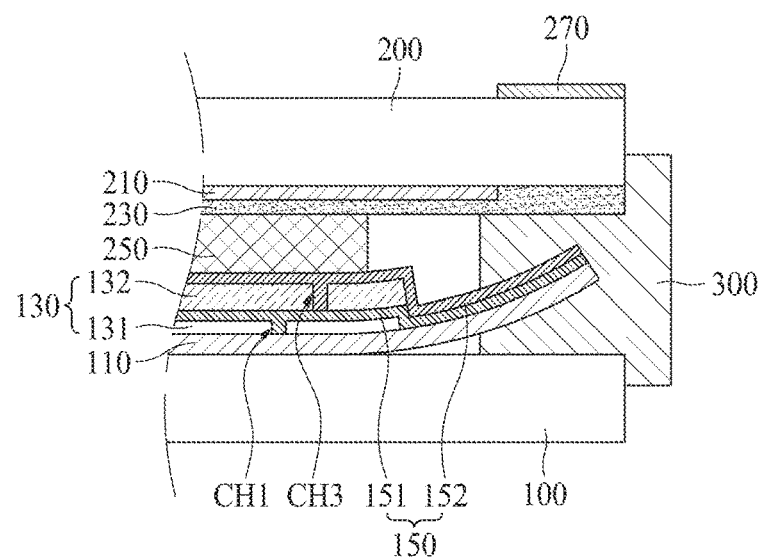
FIG. 14 is a cross-sectional view illustrating a display device according to an embodiment of the present invention.

FIG. 14 is a cross-sectional view illustrating a display device according to another embodiment of the present invention. Except for a structure of each of an insulating layer 130 and an auxiliary electrode 150, the display device of FIG. 14 is the same as the display device of FIG. 9. Thus, only different parts will be described in detail.

Referring to FIG. 14, an end portion of a first insulating layer 131 and an end portion of a second insulating layer 132 are not extended to an end portion of a pad 110, and an end portion of a first auxiliary electrode 151 and an end portion of a second auxiliary electrode 152 are extended to the end portion of the pad 110. Accordingly, a lower surface of the first auxiliary electrode 151 is in direct contact with an upper surface of the end portion of the pad 110, and a lower surface of the second auxiliary electrode 152 is in direct contact with an upper surface of the first auxiliary electrode 151.

In this embodiment, the first insulating layer 131 and the second insulating layer 132 are not bent or bent slightly so that it is possible to reduce or prevent cracks or broken parts inside the first insulating layer 131 and the second insulating layer 132, to thereby reduce or prevent cracks or broken parts in the pad 110, the first auxiliary electrode 151, and the second auxiliary electrode 152. Similar to the structure illustrated in FIG. 13, it is possible to omit first and third contact holes (CH1, CH3) from the structure illustrated in FIG. 14.

Figure 15:
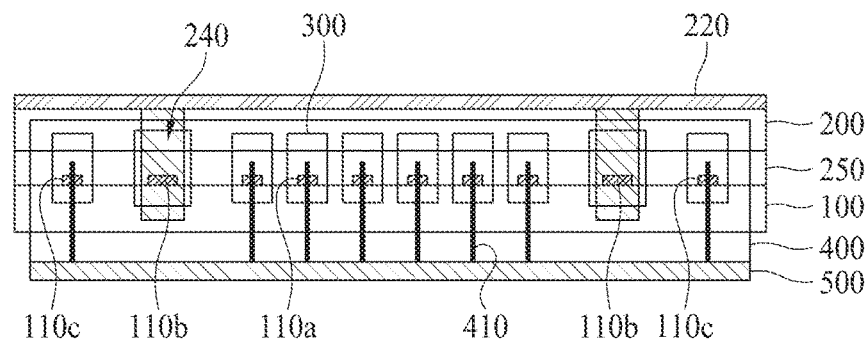
FIG. 15 is a lateral-side view illustrating a region with a pad in a display device according to an embodiment of the present invention.

FIG. 15 is a lateral side view illustrating a region with a pad in a display device according to one embodiment of the present invention.

Referring to FIG. 15, first and second substrates 100 and 200 confronting each other are bonded to each other by the use of sealant 250. Herein, pads 110*a*, 110*b* and 110*c* are provided on the first substrate 100. In FIG. 15, an insulating layer provided on the pads 110*a*, 110*b* and 110*c* is not shown.

The pads 110*a*, 110*b* and 110*c* may include a gate/data pad 110*a*, an anti-static pad 110*b*, and a common voltage pad 110*c*. Various types and arrangements of the pads 110*a*, 110*b* and 110*c* may be applied, which are generally known to those skilled in the art.

A connection electrode 300 is connected with each of the pads 110*a*, 110*b* and 110*c*. That is, each connection electrode 330 is connected with each pad 110*a*, 110*b* and 110*c* in an one-to-one correspondence.

The connection electrode 300 is electrically connected with a lead line 410 provided on a flexible circuit film 400, and the lead line 410 is connected with a printed circuit board 500.

Although not shown in detail, the flexible circuit film 400 is connected with a lateral surface of each of the first and second substrates 100 and 200 through the use of conductive adhesive layer, and the lead line 410 of the flexible circuit film 400 and the connection electrode 300 are electrically connected with each other through conductive balls included in the conductive adhesive layer.

In this case, the anti-static pad 110*b* is not connected with the lead line 410 provided on the flexible circuit film 400, but is connected with an anti-static layer 220 provided on the second substrate 200 via a ground line 240. The anti-static layer 220 prepared on an upper surface of the second substrate 200 is electrically connected with the anti-static pad 110 via the ground line 240 and the connection electrode 300 to remove static electricity that may be generated on the upper surface of the second substrate 200.

FIGS. 16A to 16D illustrate a process of manufacturing a display device according to one embodiment of the present invention, which illustrates a process of manufacturing the display device of FIG. 4 by way of example.

Figure 16A:
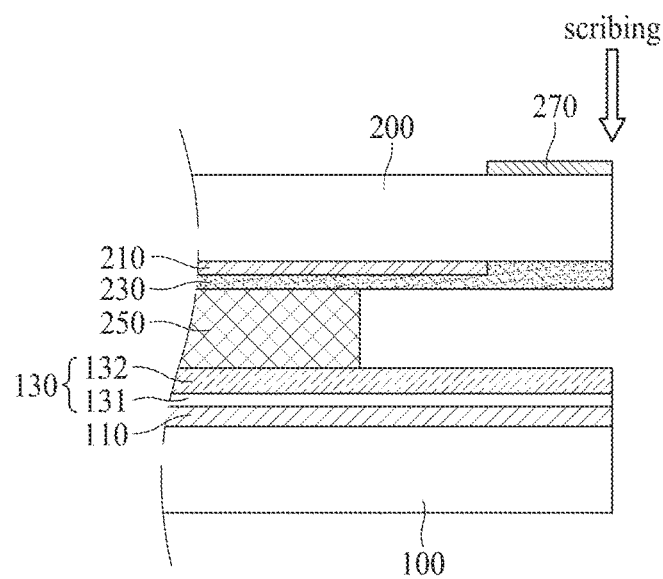
FIGS. 16A to 16D illustrate a process of manufacturing a display device according to an embodiment of the present invention.

First, as illustrated in FIG. 16A, a unit display panel is manufactured by scribing the first and second substrates 100 and 200 that are bonded to each other.

The pad 110 is provided on the first substrate 100, and the insulating layer 130 obtained by sequentially depositing the first insulating layer 131 and the second insulating layer 132 is provided on the pad 110. In this case, the end portion of the pad 110 may correspond to the end portion of the insulating layer 130. Also, the end portion of each of the pad 110 and the insulating layer 130 may correspond to the end portion of the first substrate 100.

The light-shielding layer 210 and the overcoat layer 230 are provided on the lower surface of the second substrate 200, and the light-leakage prevention pattern 270 is provided on the upper surface of the second substrate 200.

In FIG. 4, the insulating layer 130 is not provided on the upper surface of the end portion of the pad 110. In FIG. 16A, the end portion of the insulating layer 130 may not correspond to the end portion of the pad 110. In this case, the pad 110 may be broken during a grinding process illustrated FIG. 16B. Thus, in order to reduce or prevent the pad 110 from being broken during a grinding process, the end portion of the pad 110 substantially corresponds to the end portion of the insulating layer 130, preferably, as illustrated in FIG. 16A.

The first and second substrates 100 and 200 are bonded to each other by the use of sealant 250. The sealant 250 may be not extended to the end of each of the first and second substrates 100 and 200. Thus, there may be an area without the sealant 250 present between the first substrate 100 and the second substrate 200.

Meanwhile, although not shown, the auxiliary electrode 150 may be provided between the first insulating layer 131 and the second insulating layer 132, and the auxiliary electrode 150 may be connected with the pad 110 via the first contact hole (CH1) provided in the first insulating layer 131, to thereby obtain the display device of FIG. 7.

Also, the auxiliary electrode 150 may be provided on the second insulating layer 132, and the auxiliary electrode 150 may be connected with the pad 110 via the second contact hole (CH2) provided in the first insulating layer 131 and the second insulating layer 132, to thereby obtain the display device of FIG. 8.

Also, the first auxiliary electrode 151 may be provided between the first insulating layer 131 and the second insulating layer 132, the first auxiliary electrode 151 may be connected with the pad 110 via the first contact hole (CH1) provided in the first insulating layer 131, the second auxiliary electrode 152 may be provided on the second insulating layer 132, and the second auxiliary electrode 152 may be connected with the first auxiliary electrode 151 via the third contact hole (CH3) provided in the second insulating layer 132, to thereby obtain the display device of FIG. 9.

Figure 16B:
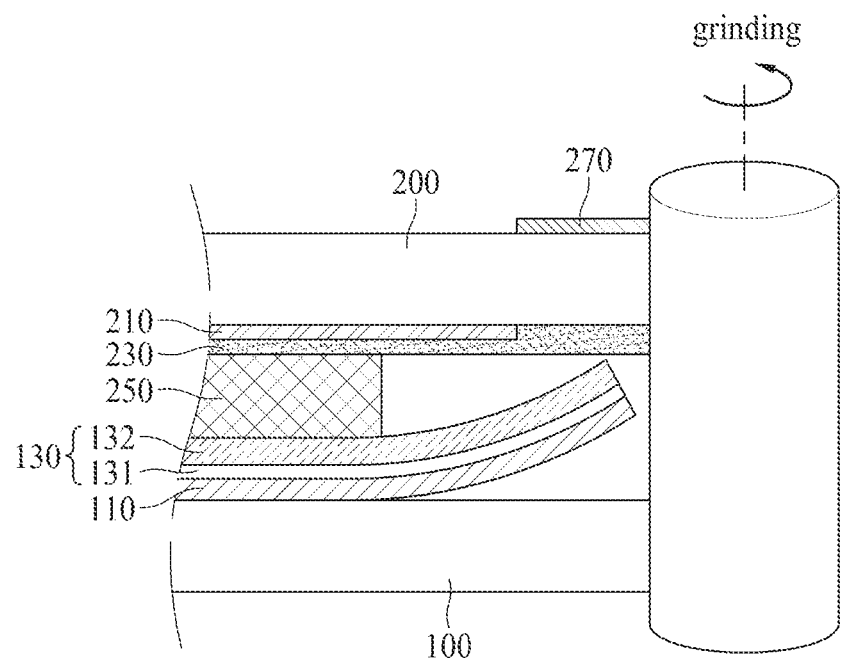

Then, as illustrated in FIG. 16B, the end portion of the pad 110 is peeled-off and separated from the upper surface of the first substrate 100, and the pad 110 and the insulating layer 130 are then upwardly bent in the area without the sealant 250.

A process of separating the end portion of the pad 110 from the first substrate 100 may be carried out by rotating a grinding apparatus 600 to be in contact with a lateral surface of the first substrate 100 and a lateral surface of the pad 110. As the grinding apparatus 600 is rotated, the lateral surface of the first substrate 100 and the lateral surface of the pad 110 are ground, and the pad 110 is separated from the first substrate 100. As the grinding apparatus 600 is additionally rotated to be in contact with a lateral surface of the second substrate 200, the lateral surface of the second substrate 200 is additionally grounded. By appropriately adjusting the grinding process, a conductive residue (e.g., the conductive residue 115 of FIG. 5) in the area between the first substrate 100 and the pad 110 may be formed of a residue of the end portion of the pad 110, which is removed during the grinding process, to thereby obtain the display device of FIG. 5.

Figure 16C:
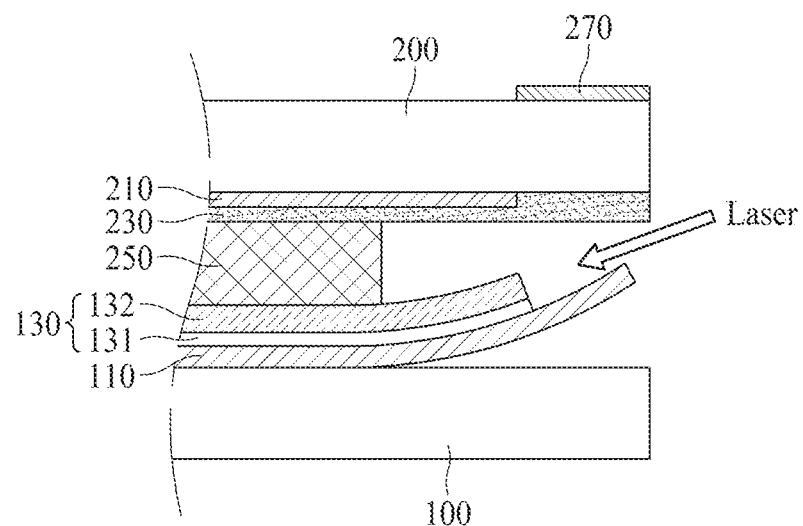

As illustrated in FIG. 16C, a predetermined portion of the insulating layer 300 provided on the upper surface of the end portion of the pad 110 is removed, to thereby expose the upper surface of the end portion of the pad 110.

The process of removing the insulating layer 300 provided on the upper surface of the end portion of the pad 110 may be carried out by a laser irradiation process. Meanwhile, it is possible to obtain the display device of FIG. 3 by omitting the process of FIG. 16C.

Figure 16D:
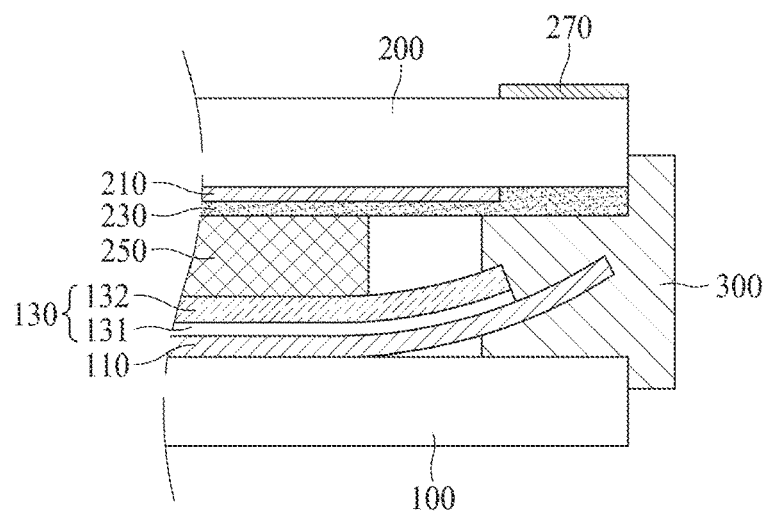

Then, as illustrated in FIG. 16D, the connection electrode 300 is connected with the pad 110. The connection electrode 300 is provided at the lateral surface of the first substrate 100 and the lateral surface of the second substrate 200. The connection electrode 300 is in contact with a lateral surface of the pad 110, a lower surface of the pad 110, and an upper surface of the pad 110.

Figure 17A:
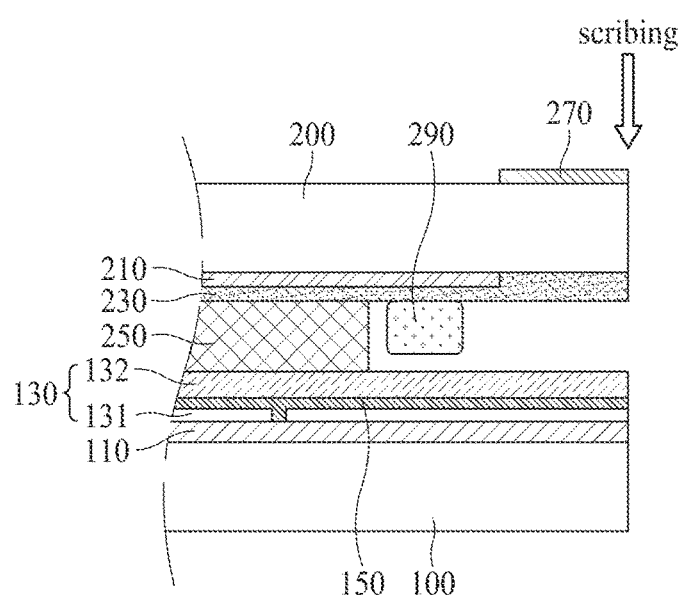
FIGS. 17A to 17C illustrate a process of manufacturing a display device according to an embodiment of the present invention.
Figure 17B:
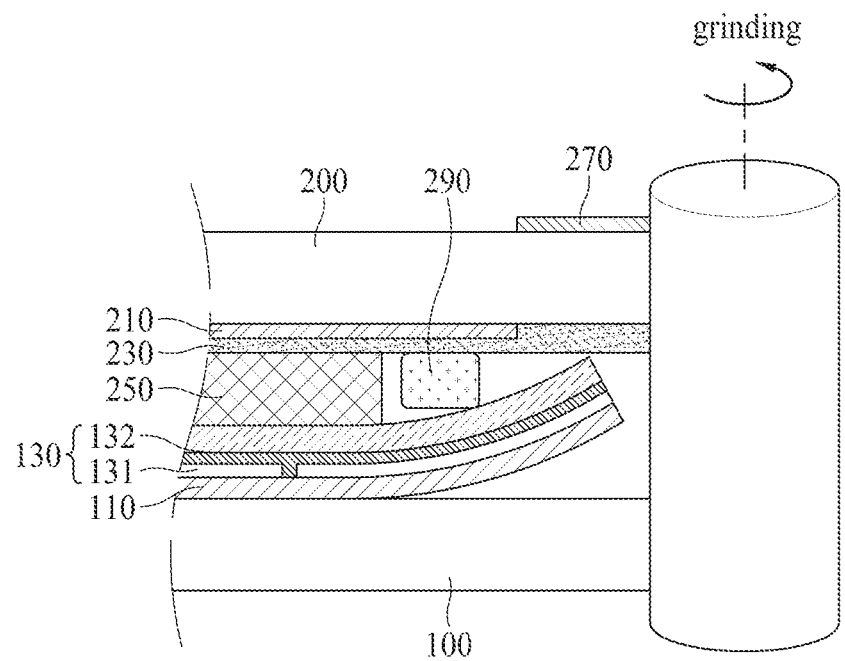
Figure 17C:
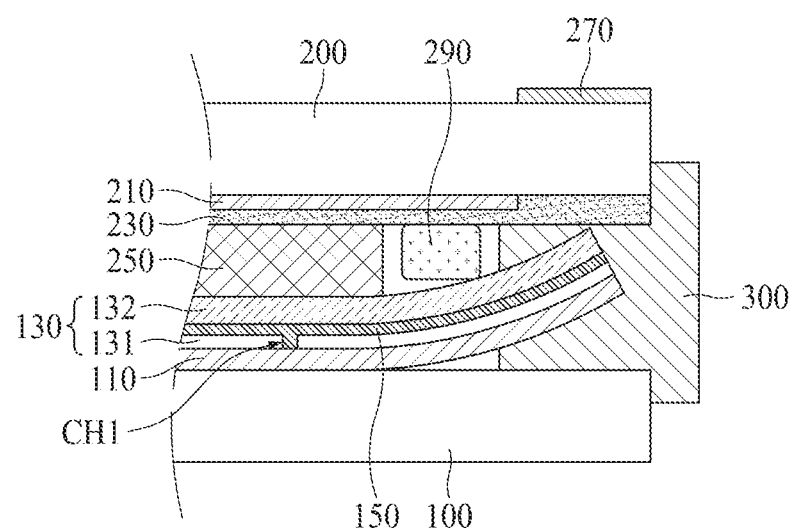

FIGS. 17A to 17C illustrate a process of manufacturing a display device according to another embodiment of the present invention, which illustrates a process of manufacturing the display device of FIG. 10.

First, as illustrated in FIG. 17A, a unit display panel is manufactured by scribing the first and second substrates 100 and 200 that are bonded to each other.

The pad 110 is provided on the first substrate 100, and the first insulating layer 131 is provided on the pad 110. Also, the auxiliary electrode 150 is provided on the first insulating layer 131, wherein the auxiliary electrode 150 is connected with the pad 110 via the first contact hole (CH1). Then, the second insulating layer 132 is provided on the auxiliary electrode 150. In this case, the end portion of each of the pad 110, the first insulating layer 131, the auxiliary electrode 150, and the second insulating layer 132 may correspond to each other. Also, the end portion of each of the pad 110, the first insulating layer 131, the auxiliary electrode 150, and the second insulating layer 132 may correspond to the end portion of the first substrate 100.

The light-shielding layer 210 and the overcoat layer 230 are provided on the lower surface of the second substrate 200, and the stopper 290 is provided on the lower surface of the overcoat layer 230. The stopper 290 is formed with an appropriate thickness being not in contact with the second insulating layer 132. Also, the light-leakage prevention pattern 270 is provided on the upper surface of the second substrate 200.

The first and second substrates 100 and 200 are bonded to each other by the use of sealant 250. The sealant 250 may be not extended to the end of each of the first and second substrates 100 and 200. Thus, there may be an area without the sealant 250 present between the first substrate 100 and the second substrate 200.

Then, as illustrated in FIG. 17B, the end portion of the pad 110 is peeled-off and separated from the upper surface of the first substrate 100, whereby the pad 110, the first insulating layer 131, the auxiliary electrode 150, and the second insulating layer 132 are upwardly bent in the area without the sealant 250.

A process of separating the end portion of the pad 110 from the first substrate 100 may be carried out by rotating a grinding apparatus 600 to be in contact with a lateral surface of the first substrate 100 a the lateral surface of the pad 110. As the grinding apparatus 600 is rotated, the lateral surface of the first substrate 100 and the lateral surface of the pad 110 are ground, and the pad 110 is separated from the first substrate 100. As the grinding apparatus 600 is additionally rotated to be in contact with a lateral surface of the second substrate 200, the lateral surface of the second substrate 200 is additionally grounded.

The end portion of each of the pad 110, the first insulating layer 131, the auxiliary electrode 150, and the second insulating layer 132 is bent by the process of separating the end portion of the pad 110 from the first substrate 100, wherein its bending degree is controlled by the stopper 290 provided on the second substrate 200. That is, if the second insulating layer 132 is brought into contact with the stopper 290, it is possible to stop the bending in the end portion of each of the pad 110, the first insulating layer 131, the auxiliary electrode 150, and the second insulating layer 132.

Then, as illustrated in FIG. 17C, the connection electrode 300 is provided and is connected with the pad 110. The connection electrode 300 is provided at the lateral surface of each of the first and second substrates 100 and 200. The connection electrode 300 is in contact with a lateral surface of the pad 110, a lower surface of the pad 110, and a lateral surface of the auxiliary electrode 150.

Figure 18A:
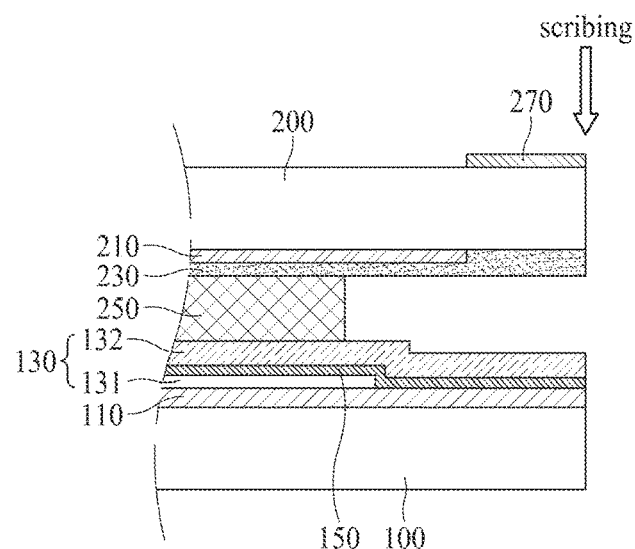
FIGS. 18A to 18C illustrate a process of manufacturing a display device according to an embodiment of the present invention.
Figure 18B:
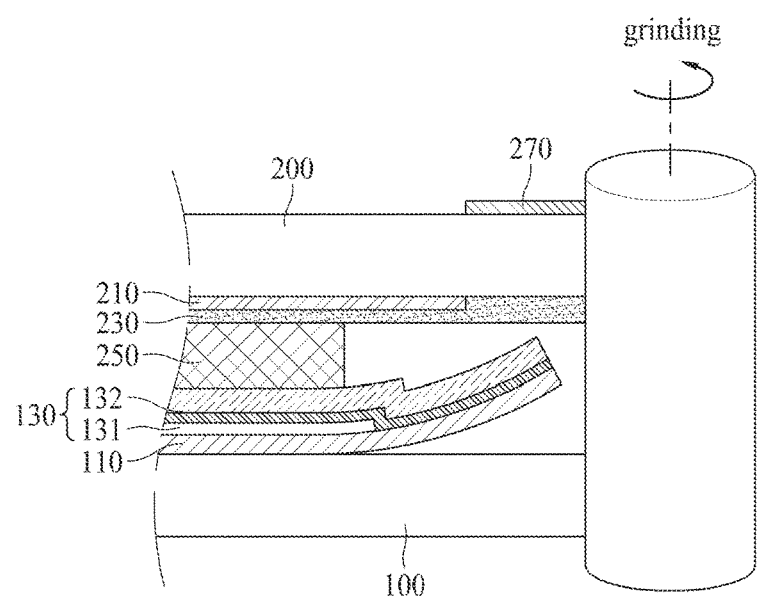
Figure 18C:
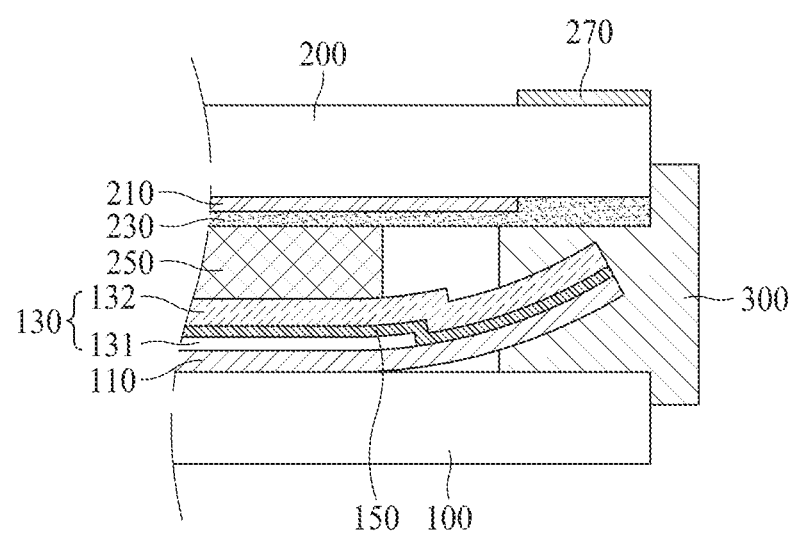

FIGS. 18A to 18C illustrate a process of manufacturing a display device according to another embodiment of the present invention, which illustrates a process of manufacturing the display device of FIG. 12.

First, as illustrated in FIG. 18A, a unit display panel is manufactured by scribing a bonding substrate obtained by bonding the first and second substrates 100 and 200 to each other.

The pad 110 is provided on the first substrate 100, and the first insulating layer 131 is provided on the pad 110. Also, the auxiliary electrode 150 is provided on the first insulating layer 131, and the second insulating layer 132 is provided on the auxiliary electrode 150. In this case, the end portion of the first insulating layer 131 is not extended to the end portion of the pad 110, whereby the lower surface of the auxiliary electrode 150 is in direct contact with the upper surface of the end portion of the pad 110. Also, the end portion of each of the pad 110, the auxiliary electrode 150, and the second insulating layer 132 may correspond to each other. Especially, the end portion of each of the pad 110, the auxiliary electrode 150, and the second insulating layer 132 may correspond to the end portion of the first substrate 100.

Meanwhile, although not shown, the first contact hole (CH1) may be provided in the first insulating layer 131, and the auxiliary electrode 150 and the pad 110 may be connected with each other via the first contact hole (CH1), to thereby obtain the display device of FIG. 11. Also, although not shown, the first substrate 100 may be formed in the structure of FIGS. 13 and 14, to thereby obtain the display device of FIGS. 13 and 14.

The light-shielding layer 210 and the overcoat layer 230 are provided on the lower surface of the second substrate 200, and the light-leakage prevention pattern 270 is provided on the upper surface of the second substrate 200.

The first and second substrates 100 and 200 are bonded to each other by the use of sealant 250. The sealant 250 may be not extended to the end portion of each of the first and second substrates 100 and 200. Thus, there may be an area without the sealant 250 present between the first substrate 100 and the second substrate 200.

Then, as illustrated in FIG. 18B, the end portion of the pad 110 is peeled-off and separated from the upper surface of the first substrate 100, whereby the pad 110, the auxiliary electrode 150, and the second insulating layer 132 are upwardly bent in the area without the sealant 250.

A process of separating the end portion of the pad 110 from the first substrate 100 may be carried out by rotating a grinding apparatus 600 to be in contact with a lateral surface of the first substrate 100 and a lateral surface of the pad 110. As the grinding apparatus 600 is rotated, the lateral surface of the first substrate 100 and the lateral surface of the pad 110 are ground, and the pad 110 is separated from the first substrate 100. As the grinding apparatus 600 is additionally rotated to be in contact with a lateral surface of the second substrate 200, the lateral surface of the second substrate 200 is additionally grounded.

Then, as illustrated in FIG. 18C, the connection electrode 300 is provided and is connected with the pad 110. The connection electrode 300 is provided at the lateral surface of each of the first and second substrates 100 and 200. The connection electrode 300 is in contact with a lateral surface of the pad 110, a lower surface of the pad 110, and a lateral surface of the auxiliary electrode 150.

According to one embodiment of the present invention, the connection electrode is connected with the pad at a lateral surface of each of the first and second substrates, whereby the flexible circuit film is attached to the lateral surface of each of the first and second substrates. Thus, there may be no need to extend the first substrate out of the second substrate so as to expose the upper surface of the pad to the external, whereby the bezel area is decreased in comparison to the related art. Also, one end portion of the first substrate at least substantially corresponds to one end portion of the second substrate, and the other end portion of the first substrate at least substantially corresponds to the other end portion of the second substrate, whereby it is possible to reduce or prevent a height difference in the bezel area.

According to one embodiment of the present invention, the pad is spaced apart from and bent upwardly on the upper surface of the first substrate so that an empty space is generated between the lower surface of the pad and the upper surface of the first substrate. The connection electrode may be partially provided in the empty space. Thus, the connection electrode is in contact with a lateral surface of the pad, and also in contact with a lower surface of the pad, to thereby improve the connection property between the connection electrode and the pad.

According to one embodiment of the present invention, the stopper is provided on the second substrate. Thus, when the pad and the insulating layer are bent, their bending degrees are controlled by the use of stopper, to thereby reduce or prevent cracks or broken parts inside the insulating layer, and furthermore to reduce or prevent cracks in the pad.

According to one embodiment of the present invention, the insulating layer and the auxiliary electrode are sequentially provided on the upper surface of the pad, wherein the end portion of the insulating layer is relatively distanced from the end portion on the first substrate in comparison to the end portion of the pad so that the lower surface of the auxiliary electrode is in direct contact with the upper surface of the end portion of the pad. Thus, the insulating layer is not bent or bent slightly so that it is possible to reduce or prevent cracks or broken parts inside the insulating layer, and furthermore to reduce or prevent cracks in the pad and the auxiliary electrode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   first and second substrates bonded to each other and forming a display panel;
   a pad on the first substrate; and
   a connection electrode electrically connected with the pad,
   wherein an end portion of the pad is spaced apart and separated from an upper surface of the first substrate, with the connection electrode provided in a space between the end portion of the pad and an upper surface of the first substrate, such that the connection electrode is in contact with a lateral surface of the pad and a lower surface of the pad.

2. The display device according to claim 1, wherein an end portion of the first substrate substantially corresponds to an end portion of the second substrate at a contact portion between the pad and the connection electrode.

3. The display device according to claim 1, further comprising a flexible circuit film that is electrically connected with the connection electrode and is attached to a lateral surface of the first substrate and a lateral surface of the second substrate, wherein the connection electrode is in contact with the lateral surface of the first substrate and the lateral surface of the second substrate.

4. The display device according to claim 1, further comprising a light-shielding layer on the second substrate, and an overcoat layer on the light-shielding layer, wherein the overcoat layer is disposed between the light-shielding layer and the connection electrode so as to insulate the light-shielding layer from the connection electrode.

5. The display device according to claim 1, wherein the end portion of the pad is provided in a bent structure, and further comprising a stopper on the second substrate for controlling a bending degree of the end portion of the pad.

6. The display device according to claim 5, wherein the stopper is overlapped with the end portion of the pad which is spaced apart and separated from the upper surface of the first substrate.

7. The display device according to claim 1, further comprising an insulating layer on the pad, and an auxiliary electrode on the insulating layer and electrically connected with the pad, wherein the connection electrode is in contact with a lateral surface of the auxiliary electrode.

8. The display device according to claim 7, wherein an end portion of the insulating layer is more distanced from the end portion of the first substrate in comparison to the end portion of the pad, and a lower surface of the auxiliary electrode is in contact with an upper surface of the end portion of the pad.

9. The display device according to claim 7, wherein an end portion of the insulating layer is more distanced from the first substrate in comparison to the end portion of the pad, and the connection electrode is additionally in contact with the upper surface of the pad.

10. The display device according to claim 9, wherein the connection electrode is additionally in contact with an upper surface of the auxiliary electrode.

11. The display device according to claim 1, further comprising a conductive residue between the first substrate and the pad, wherein the connection electrode is additionally in contact with the conductive residue.

12. The display device according to claim 1, wherein the first and second substrates are bonded to each other by a sealant, and an end portion of the sealant is more distanced from the end portion of the first substrate in comparison to the end portion of the pad.

13. The display device according to claim 1, wherein the first and second substrates have substantially a same shape and a same size, and face each other with a signal line therebetween.

14. The display device according to claim 13, wherein the pad is electrically connected with the signal line.

* * * * *